United States Patent
Ono et al.

(10) Patent No.: US 7,439,187 B2
(45) Date of Patent: Oct. 21, 2008

(54) GRAYSCALE RETICLE FOR PRECISE CONTROL OF PHOTORESIST EXPOSURE

(75) Inventors: Yoshi Ono, Camas, WA (US); Bruce D. Ulrich, Beaverton, OR (US); Pooran Chandra Joshi, Vancouver, WA (US)

(73) Assignee: Sharp Laboratories of America, Camas, WA (US)

( * ) Notice: Subject to any disclaimer, the term of this patent is extended or adjusted under 35 U.S.C. 154(b) by 235 days.

(21) Appl. No.: 11/588,891

(22) Filed: Oct. 27, 2006

(65) Prior Publication Data

US 2008/0102641 A1    May 1, 2008

(51) Int. Cl.
*H01L 21/00* (2006.01)
*H01L 21/302* (2006.01)

(52) U.S. Cl. ............ 438/717; 438/34; 438/48; 438/942; 257/E21.023

(58) Field of Classification Search ........... 438/34, 438/48, 717, 942; 257/E21.023
See application file for complete search history.

(56) References Cited

U.S. PATENT DOCUMENTS

| | | | |
|---|---|---|---|
| 5,213,916 A | 5/1993 | Cronin et al. | |
| 5,334,467 A | 8/1994 | Cronin et al. | |
| 5,998,066 A | 12/1999 | Block et al. | |
| 6,033,766 A | 3/2000 | Block et al. | |
| 6,071,652 A | 6/2000 | Feldman et al. | |
| 6,420,073 B1 | 7/2002 | Suleski et al. | |
| 6,506,623 B2 * | 1/2003 | Teshima et al. | 438/73 |
| 6,524,756 B1 | 2/2003 | Wu | |
| 6,617,189 B1 * | 9/2003 | Chen et al. | 438/48 |
| 6,620,642 B2 * | 9/2003 | Dudoff et al. | 438/26 |
| 7,169,712 B2 * | 1/2007 | Taguchi | 438/717 |

* cited by examiner

*Primary Examiner*—Scott B. Geyer
*Assistant Examiner*—Seahvosh J Nikmanesh
(74) *Attorney, Agent, or Firm*—David C. Ripma

(57) ABSTRACT

A method of fabricating a grayscale reticule includes preparing a quartz substrate; depositing a layer of silicon-rich oxide on the quartz substrate; depositing a layer of silicon nitride as an oxidation barrier layer on the silicon-rich oxide layer; depositing and patterning a layer of photoresist; etching the silicon nitride layer with a pattern for the silicon nitride layer; removing the photoresist; cleaning the quartz substrate and the remaining layers; oxidizing the quartz substrate and the layers thereon, thereby converting the silicon-rich oxide layer to a transparent silicon dioxide layer; removing the remaining silicon nitride layer; forming the quartz substrate and the silicon dioxide thereon into a reticule; and using the reticule to pattern a microlens array.

12 Claims, 5 Drawing Sheets

GRAYSCALE RETICLE FOR PRECISE CONTROL OF PHOTORESIST EXPOSURE

FIELD OF THE INVENTION

This invention relates to photolithographic imaging, and specifically to the use of a grayscale mask for masking photoresist.

BACKGROUND OF THE INVENTION

Grayscale mask technology is known to be one method for generating a range of photoresist thicknesses at a given exposure and development, using conventional photolithographic tools. The technique for generating the grayscale mask is not well established and the market for such product at this time is not particularly large. Yet, a low cost grayscale reticle may be used in many applications, from fabrication of MEMS structures to generating a dual damascene trench. It is especially useful in the field of microlens array formation, as used in an image sensor.

There are a number of ways to produce a microlens array for state of the art CCD and CMOS image sensor arrays. Currently, an array of circles is photolithography patterned into a layer of photoresist, generating cylindrically shaped resist blocks, which are then reflowed, or melted, at a high temperature to form hemispheric shapes. A dry etch then transfers the photoresist shape to a high-refractive-index material to form the microlens array. The shape of the feature is dictated by the flow process, which requires precisely defined temperature and duration, else, neighboring features will merge and flow together, destroying the desired lens shape. Thus, the distance between features needs to be relatively large. This method does not provide a particularly high-fill factor in the resulting microlens array.

A preferred alternative to the previously described technique is to use a gray scale photomask which controls the exposure over a wide range of values and generates a variety of resist thicknesses in the same layer. The proper design of the gray scale mask allows direct patterning of the microlens array into photoresist. Again, a dry etch transfers the pattern to the lens material. This enables an extremely high-fill factor on an array, approaching 100%. A significant drawback, however, is the high cost of generating a gray scale photomask, because fabrication of a grayscale mask is very difficult. The one proven, reliable method, known as high energy beam sensitive (HEBS) glass, requires several days of e-beam work, resulting in a very high cost fabrication.

U.S. Pat. No. 6,524,756, to Wu, granted Feb. 25, 2003, for Gray scale all-glass photomasks, describes a zinc silicate material that changes its light transmission properties as a function of the e-beam irradiation dose to generate a HEBS layer for the fabrication of a gray scale mask. The time required to generate a complicated array of grayscale features as in a microlens array is extremely long and the eventual cost is very high. The process uses a narrowly defined range of zinc silicate glass compositions is found to produce HEBS-glass which possesses the essential property of being a true gray level mask, which property is necessary for the fabrication of general three dimensional microstructures using a single optical exposure in a conventional photolithographic process.

U.S. Pat. No. 6,071,652, to Feldman et al., granted Jun. 6, 2000, for Fabricating optical elements using a photoresist formed from contact printing of a gray level mask, and U.S. Pat. No. 6,420,073 to Suleski et al., granted Jul. 16, 2002, for Fabricating optical elements using a photoresist formed from proximity printing of a gray level mask, describe processes which generates a structure similar to that shown in FIG. 1a, herein. Grayscale patterns are created by varying the thickness of a light absorbing layer. Multiple binary masks may be used to generate such thickness variations.

U.S. Pat. No. 6,033,766, to Block et al., granted Mar. 7, 2000, and U.S. Pat. No. 5,998,066 to Block et al., granted Dec. 7, 1999, both for Gray scale mask and depth pattern transfer technique using inorganic chalcogenide glass, describe use of an inorganic chalcogenide glass, such as a selenium germanium, coated with a thin layer of silver, a gray scale mask may be produced with accurate control of the size, uniformity and variance of the pixels. The selenium germanium glass is composed of column structures arranged perpendicularly to the substrate, resulting in a possible edge precision of 100 Å. The gray scale mask may be used to impress information as a modulated thickness on a selenium germanium photoresist layer on an inorganic substrate. The selenium germanium photoresist layer may then transfer the gray scale to the substrate.

U.S. Pat. No. 5,334,467 to Cronin et al., granted Aug. 2, 1994, for Gray level mask, and U.S. Pat. No. 5,213,916 to Cronin et al., granted May 25, 1993, for Method of making a gray level mask, describe use of a gray level mask suitable for photolithography, which is constructed of a transparent glass substrate which supports plural levels of materials having different optical transmissivities. In the case of a mask employing only two of these levels, one level may be constructed of a glass made partially transmissive by substitution of silver ions in place of metal ions of alkali metal silicates employed in the construction of the glass. The second layer may be made opaque by construction of the layer of a metal such as chromium. The mask is fabricated with the aid of a photoresist structure which is etched in specific regions by photolithographic masking to enable selective etching of exposed regions of the level of materials of differing optical transmissivities. Various etches are employed for selective etching of the photoresist, the metal of one of the layers, and the glass of the other of the layers. The etches include plasma etch with chloride ions to attack the chromium of the opaque layer, compounds of fluorine to attack the glass layer, and reactive ion etching with oxygen to attack the photoresist structure. Also, developer is employed for etching on hardened regions of resist in the photoresist structure.

SUMMARY OF THE INVENTION

A method of fabricating a grayscale reticle includes preparing a quartz substrate; depositing a layer of silicon-rich oxide on the quartz substrate; depositing a layer of silicon nitride as an oxidation barrier layer on the silicon-rich oxide layer; depositing and patterning a layer of photoresist; etching the silicon nitride layer with a pattern for the silicon nitride layer; removing the photoresist; cleaning the quartz substrate and the remaining layers; oxidizing the quartz substrate and the layers thereon, thereby converting the silicon-rich oxide layer to a transparent silicon dioxide layer; removing the remaining silicon nitride layer; forming the quartz substrate and the silicon dioxide thereon into a reticle; and using the reticle to pattern a microlens array.

It is an object of the invention to provide a gray scale reticle for use in microlens fabrication processes.

Another object of the invention is to provide a method of fabricating a gray scale reticle which has a near 100% fill factor.

This summary and objectives of the invention are provided to enable quick comprehension of the nature of the invention.

A more thorough understanding of the invention may be obtained by reference to the following detailed description of the preferred embodiment of the invention in connection with the drawings.

DETAILED DESCRIPTION OF THE PREFERRED EMBODIMENTS

This invention utilizes the partial light transmission characteristics of a silicon-rich oxide thin film deposited on a transparent quartz substrate. This is masked with a second thin film of silicon nitride, which is patterned and etched to selectively oxidize some regions of the silicon-rich oxide while preserving the partial transmission characteristic of the nitride-protected area. The oxidized regions are converted from a partially-transmitting material to a highly-transmitting material. The border area adjacent the nitride-protected and nitride-unprotected regions is a partially oxidized, silicon-rich oxide, which transmits a portion of light greater than that transmitted by the fully protected region, does not transmit as much light as that transmitted by the exposed regions. The nitride mask layer is removed by a selective etch to form the desired photomask.

FIG. 1 depicts the use of a partially transmitting film in various schemes to generate a gray scale mask. FIG. 1a is the result of a simple step etch after single or multiple lithography step(s) to change the thickness of the partially transmitting layer (TL) which in turn determines the amount of light transmitted. Layer TL is carried on a substrate (S). The problem with the film of FIG. 1a is that the abrupt edge (E) scatters light, represented by arrow (L), which, because a microlens array has a large number of features, can be a substantial amount of light. In reality, the edge is most likely not very abrupt because of the etch process, which typically leaves a slightly sloped edge, which, however, scatters even more light. The step structures resulting from this fabrication techniques generate optical interference effects with monochromatic light, so that precise control of the dose is very difficult.

Figure 1A:
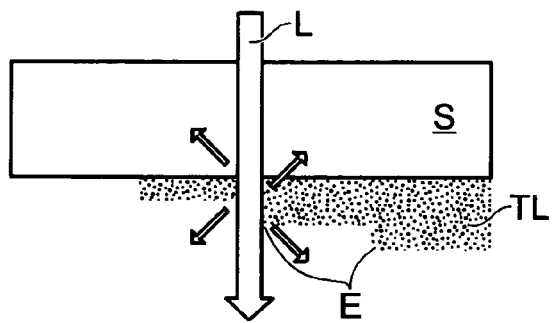
FIG. 1 depicts several grayscale mask film patterns which may be used for generating gradations in exposure.
Figure 1B:
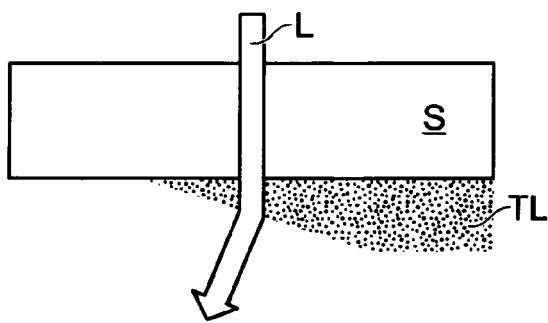
Figure 1C:
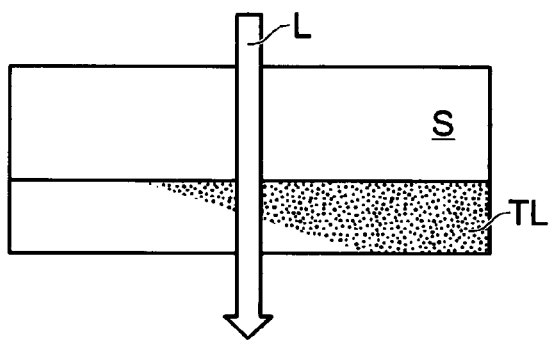
Figure 1D:
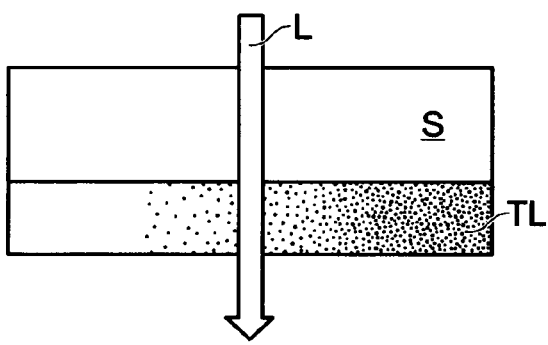

FIG. 1b depicts a gradual transition in thickness of the partially transmitting layer. Such sloped features result in refraction of the light so that, along with partially transmitting light, light is deflected. Any light deflected by the focusing optics of the stepper is lost, resulting in lens shapes in the middle of the die field which are different from those near the edge. FIG. 1c depicts a variation of the schemes of FIG. 1a and FIG. 1b, where a planarizing layer is applied to eliminate or minimize deflection. This may be either a spin-on-glass coating, silicon dioxide or a PECVD film of silicon dioxide planarized with CMP. The applied film must match the refractive index of the partially transmitting layer to minimize refraction. FIG. 1d depicts a film that gradually changes its light transmission characteristics without changing thickness or introducing refraction. The invention disclosed in this document generates a structure as in FIG. 1d.

The method of the invention begins with preparation of a quarts substrate, and with the deposition of a silicon-rich oxide layer on the quartz substrate. The silicon richness and the gaseous components, present during film deposition, affects the films refractive index and light absorbing characteristics.

Figure 2:
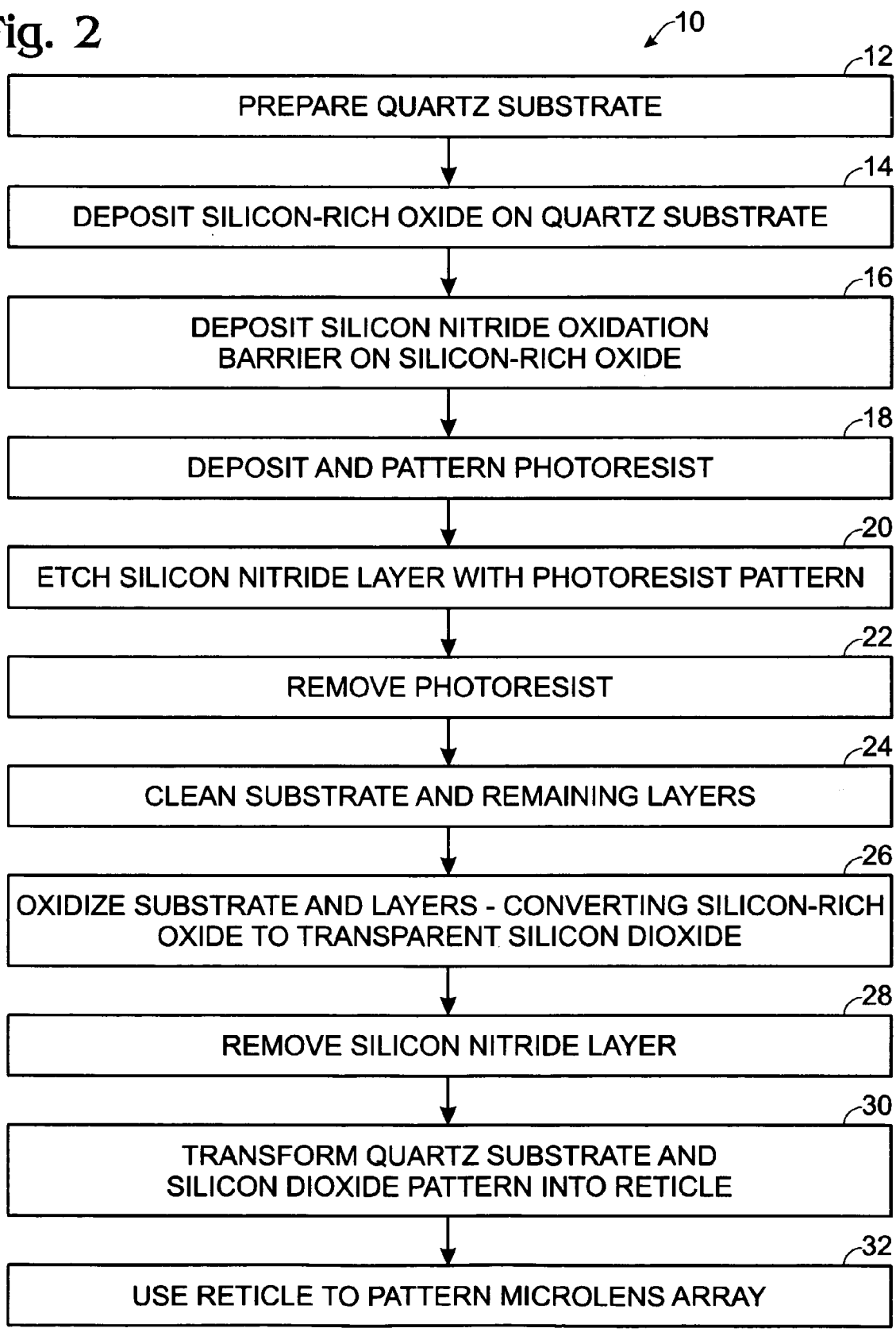
FIG. 2 is a block diagram of the method of the invention.

Referring now to FIG. 2, the method of the invention is depicted generally at 10. Initially, a quartz substrate is prepared, 12. A layer of silicon-rich oxide is deposited on the quarts substrate, 14. A layer of silicon nitride, which acts as an oxidation barrier layer, is deposited on the silicon-rich oxide layer, 16.

A layer of photoresist is deposited and patterned, 18, followed by etching of the nitride layer, 20, with the pattern of the silicon nitride layer. The photoresist is removed, 22, and the substrate and remaining layers are cleaned, 24. The substrate and the layers thereon are then oxidized, thereby converting the silicon-rich oxide layer to a transparent $SiO_2$ layer, 26. The silicon nitride mask is removed, 28.

The transformed quartz substrate and transparent $SiO_2$ layer are made into a reticle, 30, which reticle is used to pattern a microlens array, 32.

Figure 3:
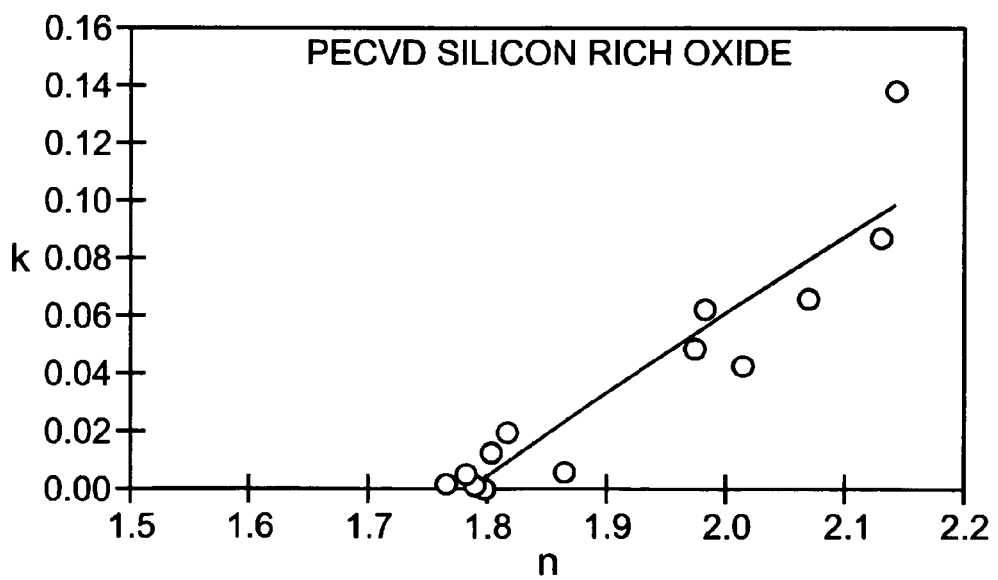
FIG. 3 depicts the interdependence of n and k at 365 nm for various silicon rich oxide films.

The plot of FIG. 3 shows how the refractive index (n), and the imaginary component of the refractive index (k) are interrelated for a variety of silicon-rich oxide films at the photolithographic Hg i-line wavelength. The k parameter is the main factor in determining the light transmission characteristics of the film. Generally, the higher the silicon richness above stoichiometric $SiO_2$, the higher the refractive index n and k. When such films are oxidized, the refractive index n is reduced and the film becomes more transparent so that the value of k is also reduced. With sufficient oxidation, n will be close to 1.47 and k will be 0. By controlling the specific locations where the film is oxidized, a true gray scale mask can be generated. The oxidation step does not appreciable alter the film thickness. The alternative to oxidizing the SRO film is etching the SRO film. Etching, however, generates variations in light transmission as a function of film thickness due to interference effects. The method of the invention provides a way to avoid such interference effects.

Figure 4:
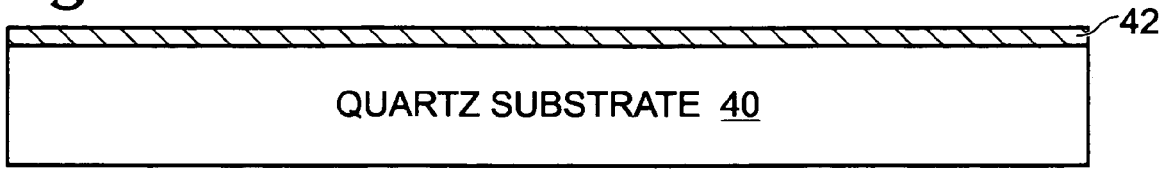
FIG. 4 depicts deposition of a SRO layer on a quartz substrate.

The general fabrication sequence is shown beginning with FIG. 4. The quartz substrate 40 is prepared, and a layer of silicon-rich oxide (SRO) 42 film is deposited the quartz substrate. Because an oxidation step is subsequently performed, it is preferred that a quartz substrate be used, as quartz has a higher melting temperature than does glass, which typically cannot tolerate a process temperature greater than 600° C. The thickness of the SRO film is determined so that the light transmission characteristic of the SRO film, once rendered transparent, on quartz is between about 10% to 50% that of the bare quartz substrate, which percentages are determined from the photo response characteristics of the photoresist, i.e., as the thickness of the photoresist increases, the exposure increases. This typically requires a SRO film thickness of between about 0.1 μm to 1.0 μm.

Figure 5:
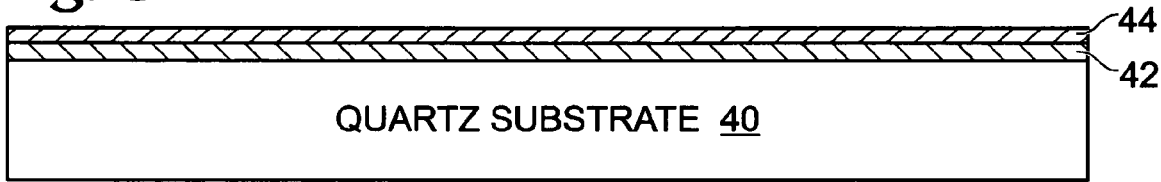
FIG. 5 depicts deposition of a thin silicon nitride layer.

Turning now to FIG. 5, a thin silicon nitride oxidation barrier layer 44 is deposited. This may be as thin as practical, e.g., 10 nm to 100 nm, and may be deposited by PECVD or LPCVD processes.

Figure 6:
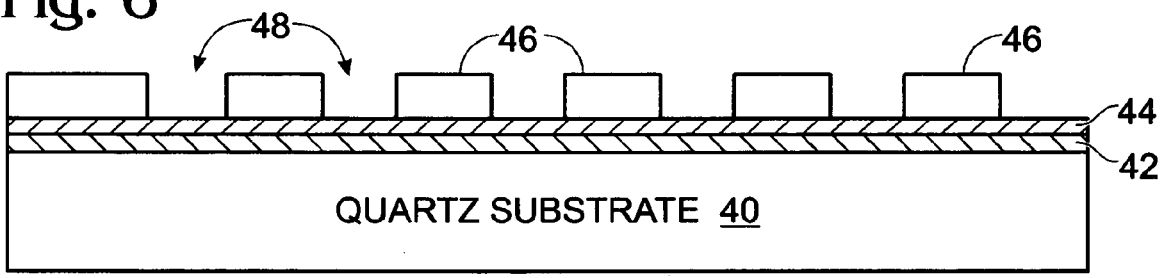
FIG. 6 depicts a photolithography process using an array of openings.

FIG. 6 depicts deposition of a photoresist layer 46, and patterning of the microlens array, in this case, as an array of holes 48. Typically, a 2 μm pitch array is required on a square pattern. The pitch may actually vary from as high as 10 μm to as small as 1.0 μm. The size of the opening may vary from 0.5 μm to as large as 1.0 μm.

Figure 7:
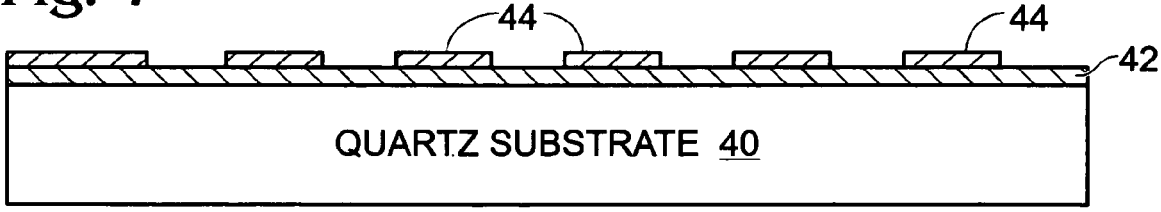
FIG. 7 depicts the device after nitride etching, which stops on SRO.

Nitride layer 44 is etched, preferably with a dry etch which is selective to SRO layer 42, as shown in FIG. 7. A timed etch in an SF6 plasma is an example of a viable nitride etch. Photoresist layer 46 is removed after the etching step.

Figure 8:
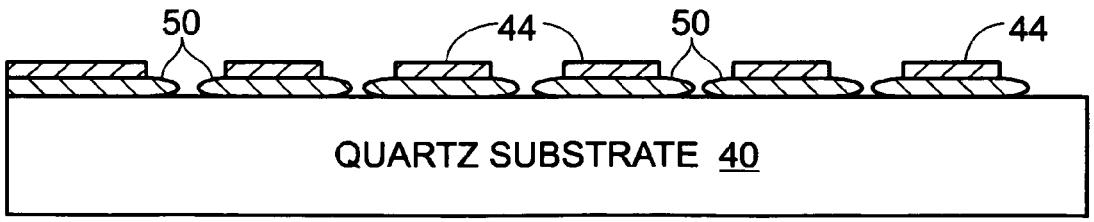
FIG. 8 depicts an oxidation step, which converts the exposed area to a transparent material.

Referring to FIG. 8, after performing substrate cleaning step 24, the wafer is placed into an oxidation furnace, where elevated temperatures, in the range of between about 800° C. to 1100° C., in an oxidizing ambient, e.g., oxygen or water vapor in nitrogen, for between about one minute to 60 minutes, converts silicon-rich oxide layer 42 into a silicon dioxide layer 50. The temperature, duration, gas flows, etc, are determined to optimize the transmissivity of the silicon dioxide layer, and may be determined by oxidation of SRO layers on either silicon or quartz substrates. Spectroscopic ellipsometry may be performed for SRO-on-silicon to determine the values of n and k at 365 nm after oxidation. For SRO-on-quartz, a measure of the light transmission characteristics at 365 nm is made and compared to values prior to oxidation. Because the thermal diffusion of the oxidizing species determines where the film becomes transparent, the regions under the nitride film remain largely unchanged. This establishes a gradient near the edge of the patterned nitride layer.

Figure 9:
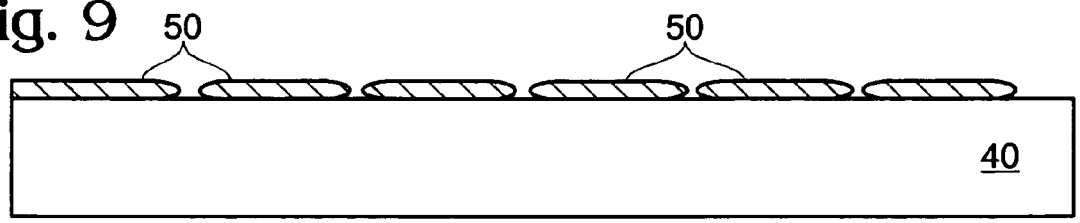
FIG. 9 depicts the device following nitride removal.

Turning to FIG. 9, nitride mask layer 44 may be removed by a wet chemical etch, such as a hot phosphoric etch, which is highly selective to the oxide.

Figure 10:
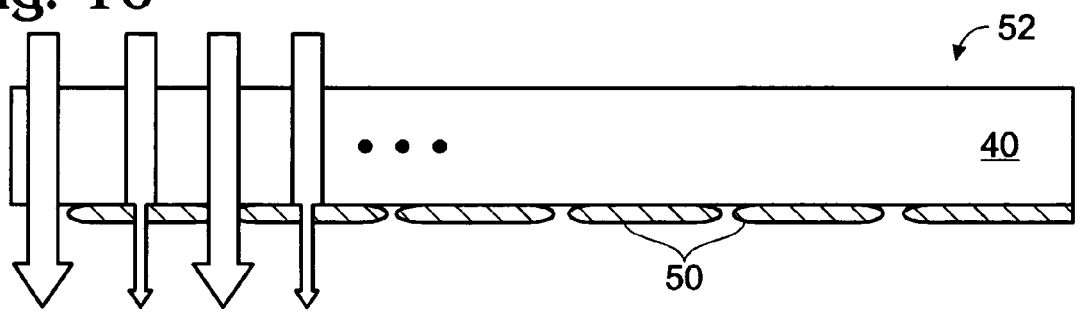
FIG. 10 depicts the film on quartz, mounted as a reticle.
Figure 11:
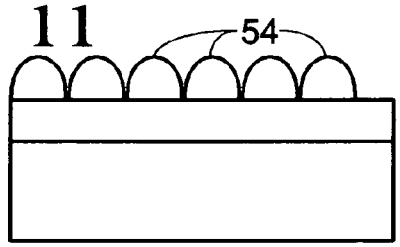
FIG. 11 is a resultant patterned photoresist layer patterned by the reticle of FIG. 9.

FIG. 10 depicts transformation of quartz substrate 42 into a reticle 52, by sawing the substrate into a rectangular shape, flipping it upside down, and mounting it in a custom built reticle holder (not shown). The reticle holder has all the requisite alignment features required by the stepper. When exposing a wafer with negative resist coated, photoresist bumps 54 are generated, as shown in FIG. 11. A pattern transfer etch then generates the lens array. If positive resist is used, concave dimples are formed, which, when patterned and transferred to the substrate, are useful as a microlens template for imprint applications.

Figure 12:
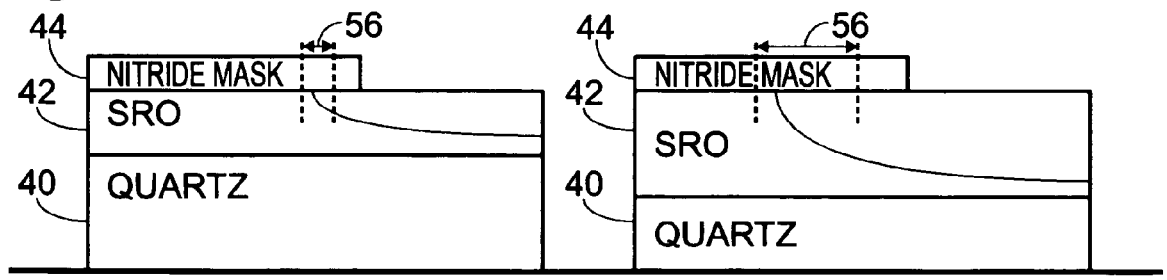
FIG. 12 depicts setting of a lateral distance of the transition region for grayscale gradations.

FIG. 12 depicts the preferred embodiment for the microlens application, wherein the lateral distance for the transition, the distance between arrows 56, from the original partial transmission to transparent condition is a critical parameter. The critical distance is on the order of about 20% of the microlens array pitch. This transition region is primarily responsible for determining the lens profile. The interaction between film thickness, oxidation temperature, oxidation time, and oxidizing species will have an impact on the eventual lens profile. The ability to tailor the distance of the transition region is shown in FIG. 12.

Figure 13:
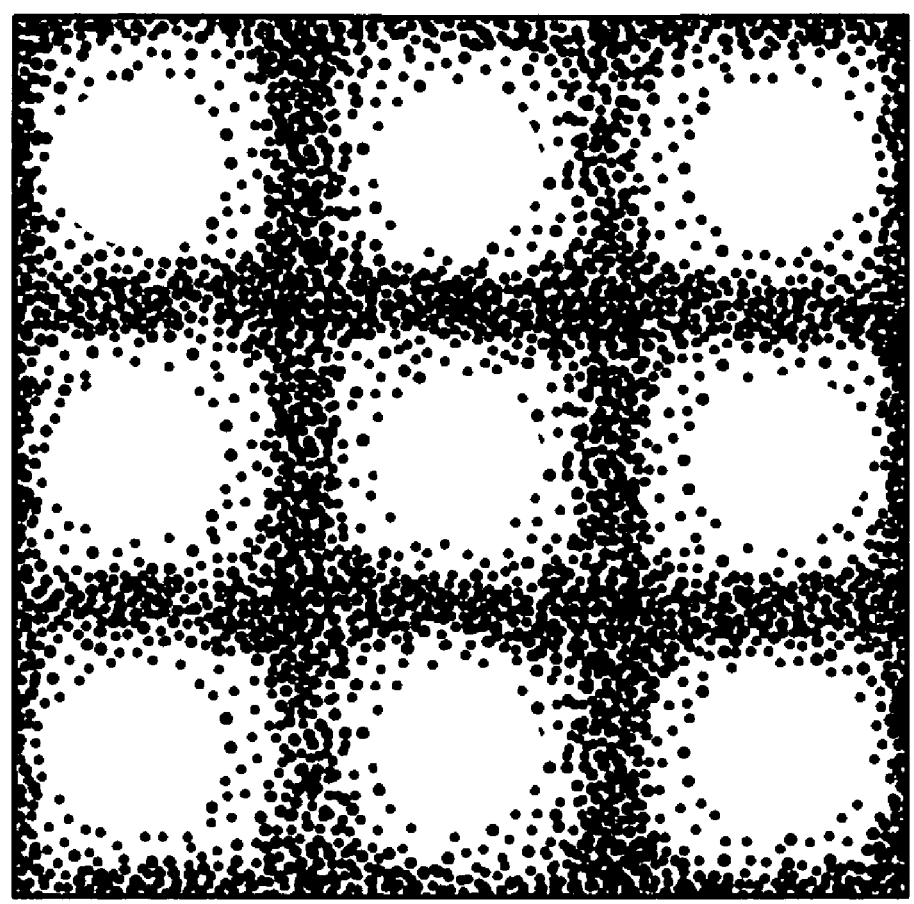
FIG. 13 is a top view of the reticle of the array.

The final mask is depicted in FIG. 13, which shows a 3×3 portion of the array.

For non-microlens array applications, such as MEMS and dual damascene trenches, in order to generate various gray scales, it becomes necessary to pattern arrays of minimum sized holes where the aerial density will determine the gray level. Since this is applied to a 1:5 size reduction, the holes are sub-resolutional so individual features are not discernable. A large range of gray scales may be generated in this fashion, given the method of the invention has a wide range of applications.

Thus, a method for fabricating a gray scale reticle has been disclosed. It will be appreciated that further variations and modifications thereof may be made within the scope of the invention as defined in the appended claims.

We claim:

1. A method of fabricating a grayscale reticule comprising:
preparing a substrate;
depositing a layer of silicon-rich oxide on the substrate;
depositing a layer of silicon nitride as an oxidation barrier layer on the silicon-rich oxide layer;
depositing and patterning a layer of photoresist;
etching the silicon nitride layer with a pattern for the silicon nitride layer;
removing the photoresist;
cleaning the substrate and the remaining layers;
oxidizing the substrate and the layers thereon, thereby converting the silicon-rich oxide layer to a transparent silicon dioxide layer;
removing the remaining silicon nitride layer;
forming the substrate and the silicon dioxide thereon into a reticule; and
using the reticule to pattern a microlens array.

2. The method of claim 1 wherein said preparing a substrate includes preparing a quartz substrate.

3. The method of claim 1 wherein said oxidizing includes oxidizing the silicon-rich oxide to produce a silicon dioxide layer having a refractive index of about 1.47.

4. The method of claim 1 wherein said oxidizing includes oxidizing the silicon-rich oxide to produce a silicon dioxide layer having an n-value of about zero.

5. The method of claim 1 wherein said oxidizing includes oxidizing the silicon-rich oxide to produce a transmissivity of between about 10% to 50% that of the substrate.

6. The method of claim 1 wherein said oxidizing includes oxidizing at a temperature in the range of between about 800° C. to 1100° C., in an oxidizing ambient taken from the group of oxidizing ambient consisting of oxygen and water vapor, in nitrogen, for between about one minute to sixty minutes.

7. The method of claim 1 wherein said patterning the photoresist includes patterning to form a mask which produces a square pattern therein having a pitch array of between about 1.0 μm to 10 μm, and having an opening from between about 0.5 μm to 1.0 μm.

8. A method of fabricating a grayscale reticule comprising:
preparing a quartz substrate;
depositing a layer of silicon-rich oxide on the quartz substrate;
depositing a layer of silicon nitride as an oxidation barrier layer on the silicon-rich oxide layer;
depositing and patterning a layer of photoresist;
etching the silicon nitride layer with a pattern for the silicon nitride layer;
removing the photoresist;
cleaning the substrate and the remaining layers;
oxidizing the substrate and the layers thereon, thereby converting the silicon-rich oxide layer to a transparent silicon dioxide layer to produce a transmissivity of between about 10% to 50% that of the quartz substrate.
removing the remaining silicon nitride layer;
forming the quartz substrate and the silicon dioxide thereon into a reticule; and
using the reticule to pattern a microlens array.

9. The method of claim 8 wherein said oxidizing includes oxidizing the silicon-rich oxide to produce a silicon dioxide layer having a refractive index of about 1.47.

10. The method of claim 8 wherein said oxidizing includes oxidizing the silicon-rich oxide to produce a silicon dioxide layer having an n-value of about zero.

11. The method of claim 8 wherein said oxidizing includes oxidizing at a temperature in the range of between about 800° C. to 1100° C., in an oxidizing ambient taken from the group of oxidizing ambient consisting of oxygen and water vapor, in nitrogen, for between about one minute to sixty minutes.

12. The method of claim 8 wherein said patterning the photoresist includes patterning to form a mask which produces a square pattern therein having a pitch array of between about 1.0 μm to 10 μm, and having an opening from between about 0.5 μm to 1.0 μm.

* * * * *